United States Patent
Saito et al.

(10) Patent No.: US 9,355,987 B2
(45) Date of Patent: May 31, 2016

(54) ELECTRONIC COMPONENT AND MANUFACTURING METHOD FOR ELECTRONIC COMPONENT

(71) Applicant: FUJI ELECTRIC CO., LTD., Kawasaki-shi (JP)

(72) Inventors: Takashi Saito, Matsumoto (JP); Tatsuo Nishizawa, Matsumoto (JP); Yoshito Kinoshita, Hino (JP); Norihiro Nashida, Nagano (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/482,830

(22) Filed: Sep. 10, 2014

(65) Prior Publication Data

US 2014/0374775 A1    Dec. 25, 2014

Related U.S. Application Data

(63) Continuation of application No. PCT/JP2012/070907, filed on Aug. 17, 2012.

(51) Int. Cl.
*H01L 23/52* (2006.01)
*H01L 21/4763* (2006.01)
(Continued)

(52) U.S. Cl.
CPC .............. *H01L 24/33* (2013.01); *H01L 24/05* (2013.01); *H01L 24/83* (2013.01); *H01L 24/27* (2013.01);
(Continued)

(58) Field of Classification Search
CPC ......... H01L 24/27; H01L 24/29; H01L 24/33; H01L 2224/33505; H01L 2924/01029; H01L 2924/01047

USPC .......... 438/625, 652, 654, 686–688; 257/750, 257/753, 762–766
See application file for complete search history.

(56) References Cited

U.S. PATENT DOCUMENTS

2003/0102153 A1* 6/2003 Sugaya et al. ................. 174/256
2006/0160330 A1    7/2006 Kobayashi et al.
(Continued)

FOREIGN PATENT DOCUMENTS

CN    1819172 A    8/2006
JP    07-263493 A    10/1995
(Continued)

OTHER PUBLICATIONS

International Search Report, dated Oct. 23, 2012, issued in PCT/JP2012/070907.
(Continued)

*Primary Examiner* — Hsien Ming Lee
(74) *Attorney, Agent, or Firm* — Rossi, Kimms & McDowell LLP

(57) ABSTRACT

A first metal film, of which major component is copper, is formed on a surface of a conductive portion which becomes a front surface electrode of a semiconductor element. A second metal film of which major component is silver is formed on a surface of the first metal film. A metal plate, which electrically connects the conductive portion and the other members (e.g. a circuit pattern of an insulated substrate) is bonded with a surface of the second metal film via a bonding layer containing silver particles. The second metal film does not contain nickel which decreases the bonding strength between the second metal film and the bonding layer containing silver particles. With the above configuration, an electronic component having a high bonding strength, excellent heat resistance and radiation performance, and a manufacturing method for the electronic component can be provided.

14 Claims, 8 Drawing Sheets

(51) Int. Cl.
*H01L 21/44* (2006.01)
*H01L 23/00* (2006.01)

(52) U.S. Cl.
CPC ............... *H01L 24/29* (2013.01); *H01L 24/32* (2013.01); *H01L 2224/0346* (2013.01); *H01L 2224/04026* (2013.01); *H01L 2224/05023* (2013.01); *H01L 2224/05073* (2013.01); *H01L 2224/05124* (2013.01); *H01L 2224/05147* (2013.01); *H01L 2224/05564* (2013.01); *H01L 2224/05568* (2013.01); *H01L 2224/05573* (2013.01); *H01L 2224/05639* (2013.01); *H01L 2224/05644* (2013.01); *H01L 2224/27332* (2013.01); *H01L 2224/29294* (2013.01); *H01L 2224/29339* (2013.01); *H01L 2224/32014* (2013.01); *H01L 2224/32238* (2013.01); *H01L 2224/32245* (2013.01); *H01L 2224/33181* (2013.01); *H01L 2224/33505* (2013.01); *H01L 2224/48229* (2013.01); *H01L 2224/8384* (2013.01); *H01L 2224/83191* (2013.01); *H01L 2224/83192* (2013.01); *H01L 2224/83203* (2013.01); *H01L 2224/83439* (2013.01); *H01L 2224/85205* (2013.01); *H01L 2924/00011* (2013.01); *H01L 2924/01029* (2013.01); *H01L 2924/01047* (2013.01)

(56) References Cited

U.S. PATENT DOCUMENTS

| | | |
|---|---|---|
| 2006/0267218 A1 | 11/2006 | Hozoji et al. |
| 2012/0068321 A1* | 3/2012 | Watanabe et al. ............. 257/676 |

FOREIGN PATENT DOCUMENTS

| | | |
|---|---|---|
| JP | 3484367 B2 | 10/2003 |
| JP | 2004-115902 A | 4/2004 |
| JP | 2005-136375 A | 5/2005 |
| JP | 2006-131949 A | 5/2006 |
| JP | 2006-202938 A | 8/2006 |
| JP | 2007-180059 A | 7/2007 |
| JP | 4096671 B2 | 3/2008 |
| JP | 2008-208442 A | 9/2008 |
| JP | 2010050189 A | 3/2010 |
| JP | 2012-064826 A | 3/2012 |

OTHER PUBLICATIONS

Official Action issued in Chinese Appln. No. 201280071499.4 mailed Jan. 27, 2016. Partial English translation provided.

Official Action issued in Japanese Appln. No. 2014-530426 mailed Mar. 22, 2016. Partial English translation provided.

* cited by examiner

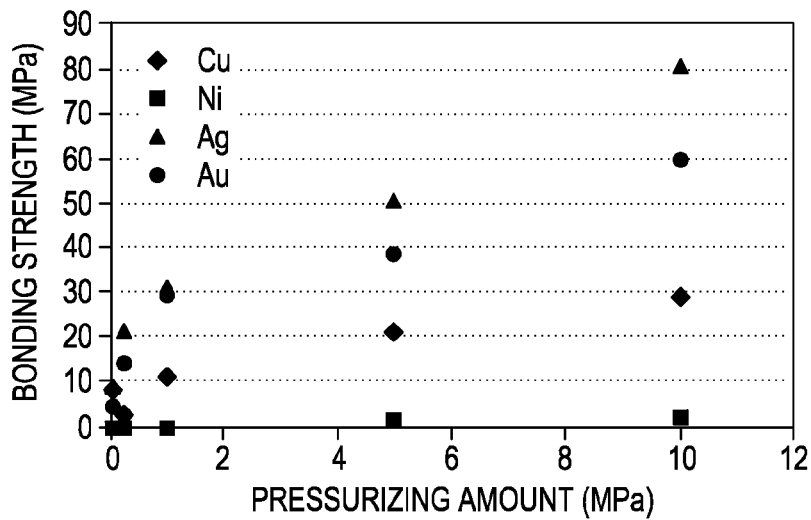
FIG.4
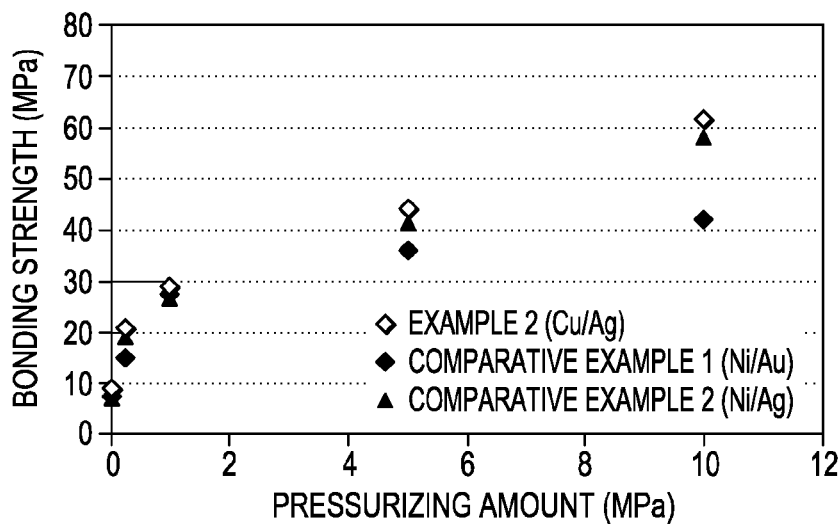
FIG.5
| PRESSURIZING AMOUNT (MPa) | | 0 | 0.25 | 1 | 5 | 10 |
|---|---|---|---|---|---|---|
| BONDING STRENGTH (MPa) | EXAMPLE 2 (Cu/Ag) | 9 | 21.5 | 29 | 44 | 60.1 |
| | COMPARATIVE EXAMPLE 1 (Ni/Au) | 7.2 | 15 | 26.9 | 36.3 | 42.5 |
| | COMPARATIVE EXAMPLE 2 (Ni/Ag) | 7.3 | 19 | 27.2 | 41.7 | 58.8 |
FIG.6

|  | COMPONENT | BEFORE HEATING | | | | AFTER HEATING | | |
| --- | --- | --- | --- | --- | --- | --- | --- | --- |
|  |  | EXAMPLE 2 (Cu/Ag) | COMPARATIVE EXAMPLE 1 (Ni/Au) | COMPARATIVE EXAMPLE 2 (Ni/Ag) | EXAMPLE 3 (Cu/Ag) | COMPARATIVE EXAMPLE 3 (Ni/Au) | COMPARATIVE EXAMPLE 4 (Ni/Ag) |
| COMPONENT PERCENTAGE (%) | C | 35.3 | 44.2 | 36.7 | 32.5 | 33.9 | 35.7 |
|  | O | 31.3 | 37.6 | 27.7 | 33.1 | 42.2 | 39 |
|  | Ag | 32.3 | — | 34.7 | 31.5 | — | 22.5 |
|  | Au | — | 16.4 | — | — | 10.1 | — |
|  | Cu | 1.1 | — | — | 2.9 | — | — |
|  | Ni | — | 1.8 | 0.9 | — | 13.8 | 2.8 |

FIG.8

|  | BEFORE HEATING | | | AFTER HEATING | |
|---|---|---|---|---|---|
|  | EXAMPLE 2 (Cu/Ag) | COMPARATIVE EXAMPLE 1 (Ni/Au) | COMPARATIVE EXAMPLE 2 (Ni/Ag) | EXAMPLE 3 (Cu/Ag) | COMPARATIVE EXAMPLE 3 (Ni/Au) | COMPARATIVE EXAMPLE 4 (Ni/Ag) |
| BONDING STRENGTH (MPa) | 60.0 | 42.5 | 58.8 | 59.5 | 6.6 | 39.8 |

FIG.10

ELECTRONIC COMPONENT AND MANUFACTURING METHOD FOR ELECTRONIC COMPONENT

This application is a continuation of International Application No. PCT/JP2012/070907, filed on Aug. 17, 2012. The disclosure of the PCT application in its entirety, including the drawings, claims, and the specification thereof, is incorporated herein by reference.

BACKGROUND

1. Technical Field

The present invention relates to an electronic component and a manufacturing method for an electronic component.

2. Related Art

A semiconductor device having a package structure where a semiconductor element is bonded with a circuit pattern disposed on an insulated substrate has been proposed. As a method of bonding an electrode disposed on a front surface of a semiconductor element (hereafter called "front surface electrode") with the circuit pattern of the insulated substrate, a method of using an aluminum (Al) wire or solder for bonding is known. FIG. 11 is a cross-sectional view depicting a main section of a semiconductor device having a conventional package structure. As shown in FIG. 11, the rear surface of a semiconductor chip 101 having a semiconductor element is bonded with a circuit pattern 104 on the front surface of an insulated substrate 103 via a solder bonding layer 102.

The rear surface of the insulated substrate 103 is bonded with the front surface of a metal plate formed of copper (Cu) (hereafter called "Cu plate") 105, for example. The rear surface of the Cu plate 105 is bonded with the front face of a base material 106 via a solder bonding layer (not illustrated). A front surface electrode (not illustrated) of a semiconductor element disposed on the front surface of the semiconductor chip 101 is connected with an aluminum wire 107 by thermocompression bonding or by ultrasonic vibration, and is electrically connected with the circuit pattern 104 via the aluminum wire 107.

FIG. 12 is a cross-sectional view depicting a main section of another example of a semiconductor device having a conventional package structure. As shown in FIG. 12, a front surface electrode (not illustrated) of a semiconductor chip 101 is electrically connected with a circuit pattern 104 via a metal plate 108. The front surface electrode and the circuit pattern 104 are bonded with the metal plate 108 respectively via a solder bonding layer 102. The configuration of the semiconductor device in FIG. 12, excluding the metal plate 108, is the same as the semiconductor device in FIG. 11. In FIG. 11 and FIG. 12, a case and a terminal for an external electrode are not illustrated.

The front surface electrode of the semiconductor element is made of aluminum or aluminum alloy, for example. However aluminum has poor wettability to solder and therefore cannot firmly adhere to solder. To solve this problem, an under-bump metal film, which has high adhesion to the front surface electrode and to the solder, must be formed between the front surface electrode and the solder bonding layer. For the under-bump metal film, normally an electroless Ni/Au plating film (ENIG) is used. By using Ni/Au plating film on the surface of the front surface electrode of the semiconductor element, a firm solder bonding with the front surface electrode becomes possible.

As a method for forming such a plating film, a method of continuously performing a step of contacting a plating target material to an electroless gold plating solution that does not contain gold ions, and a step of contacting the plating target material to an electroless gold plating solution containing gold ions has been proposed. See Japanese Patent No. 3484367 (also referred to herein as "Patent Document 1").

Another method for applying a plating film on an electronic component that has been proposed is plating a conductive portion formed on a surface of a substrate body, sequentially forming an electroless Ni film of which major component is Ni and a substituted Au film of which major component is Au, and then performing after-treatment to remove the Ni compound adhering to the substituted Au film. In this method, a predetermined complexing agent, selected from citric acid, glycine, acetic acid, gluconic acid, glutamic acid, tartaric acid, ethylenediaminetetraacetic acid, diethylenetriamine pentaacetic acid, malic acid, malonic acid, sulfurous acid, ammonia and sulfamic acid is used as the Ni removing liquid, and in the after-treatment, a contact treatment is performed by contacting the Ni compound with the Ni removing liquid, so as to remove the Ni compound from the surface of the substituted Au film. See Japanese Patent No. 4096671 (also referred to as "Patent Document 2").

As an electronic component manufactured by another method for applying a plating film, the following electronic component has been proposed. In the electronic component, an Ni—P film which has a double layer structure is formed on a conductive portion which is formed on the surface of a ceramic body, and an Au film is formed on the surface of the Ni—P film. Within the Ni—P film with two layers, the first layer contains 3 to 6 wt % P, and the second layer contains 6 to 9 wt % P, and has a 0.1 μm to 1.0 μm thickness. See Japanese Patent Application Laid-open No. 2006-131949 (also referred to herein as "Patent Document 3").

As another method for applying a plating film, the following method has been proposed. To apply the plating film, a Cu electrode is formed on a ceramic body via a pre-treatment step, an auto-catalytic Ni plating step and a substituted Au plating step, and on the Cu electrode, an Ni—P film and an Au film are sequentially formed. In the after-treatment step, the ceramic body formed on the Au film is placed in a vacuum drying apparatus where pressure is reduced to 13.3 Pa or less, and a vacuum drying treatment is performed, so as to remove the moisture remaining in the interface between the Ni—P film and the Au film. Instead of the Au film, a metal of which ionization tendency is lesser than Ni, such as Ag, Cu, Pd, Pt or an alloy of these metals, may be used. See Japanese Patent Application Laid-open No. 2004-115902 (also referred to herein as "Patent Document 4").

As another method for applying a plating film, the following method has been proposed. For the connection terminal, Ni plating is applied to a copper plate, and gold plating is applied thereon. After mounting a semiconductor element on a wiring of an insulated substrate, a solution containing Au particles (average particle diameter: 5 nm) is coated on an emitter electrode (upper side) of the semiconductor element. Ni plating treatment is performed on the surface of a copper wiring pattern formed on the insulated substrate, then Au plating treatment is performed on the portion connecting with the emitter electrode of the semiconductor element via a terminal, and the solution containing Au particles is applied to the Au plated portion of the wiring. The solution containing Au coated on the semiconductor element and the wiring on the insulated substrate is dried and an electrode portion formed of gold particles is formed, then the connection terminal is mounted on the upper part of the electrode formed of gold particles, and an approximately 80° C. heat is applied for 60 minutes so as to connect the semiconductor element and the wiring. See Japanese Patent Application Laid-open No. 2005-136375 (also referred to herein as "Patent Document 5").

As yet another method for applying a plating film and a method for mounting a semiconductor element on a wiring circuit, the following method has been proposed. A thin nickel layer is formed on a metal layer of a semiconductor element by the electroless plating method, and this thin nickel layer and a wiring circuit are bonded using an anisotropic conductive adhesive. Or after the thin nickel layer is formed, a palladium alloy layer containing 0.1 to 95 wt % palladium and lead or tin is formed by the electroless plating method, and is bonded with the wiring circuit using the anisotropic conductive adhesive. The anisotropic conductive adhesive that is used contains gold, platinum or silver particles having protrusions (particle diameter: 20 μm or less) as a conductive filler, and includes epoxy resin which is mixed as a binder. See Japanese Patent Application Laid-open No. H7-263493 (also referred to herein as "Patent Document 6").

As another method for applying a plating film, the following method has been proposed. When a semiconductor element is mounted on a lead frame, Ag or Ag alloy plating film is applied to areas where the semiconductor element and the lead frame are bonded, and conductive adhesive containing nano-particles are used for the bonding material for this mounting. The conductive adhesive has a thermo-setting resin, such as epoxy resin, as a base, where silver particles having a 1 to 20 μm particles diameter and silver particles having a 20 nm or less particle diameter are mixed. See Japanese Patent Application Laid-open No. 2007-180059 (also referred to herein as "Patent Document 7").

As another method for applying a plating film, the following method has been proposed. A step of forming an oxide layer containing oxygen on a bonding interface of a bonding target member, a step of disposing a bonding material containing metal compound particles having a 1 nm to 50 μm average particle diameter, and a reducing agent formed of an organic matter, on the bonding interface, and a step of bonding the bonding target members by heating and pressurizing the area between the bonding target members, are performed. On the bonding surfaces of the bonding target members, a treatment of precipitating copper, silver or nickel by electroless plating or electric plating and oxidizing the surface of the plating metal, has been performed in advance before bonding. See Japanese Patent Application Laid-open No. 2008-208442 (also referred to herein as "Patent Document 8").

Another method of bonding a front surface electrode of a semiconductor element with a circuit pattern on an insulated substrate, a method of bonding using a bonding layer containing silver (Ag) particles, instead of solder bonding, has recently been proposed. In the bonding method using a bonding layer containing silver particles, metal particles, of which surfaces are coated with such an organic matter as a silver nano-particle bonding material, are used as a bonding material to bond metal surfaces formed by electroless plating or electric plating, so as to implement bonding having high heat resistance, reliability and radiation performance, and thereby the bonding temperature is lowered during bonding in the mounting process (see Patent Document 8).

In the case of bonding using the bonding layer containing Ag particles, the bonding portion between the front surface electrode of the semiconductor element and the bonding layer containing Ag particles must be a precious metal, such as gold or silver (Ag). As mentioned above, the front surface electrode of the semiconductor element is formed of aluminum or aluminum alloy, for example, therefore it is difficult to directly deposit (form) the gold plating film or the silver plating film on the surface of the front surface electrode of the semiconductor element. Hence an Ni/Au plating film or an Ni/Ag plating film, where an Ni plating film is sandwiched by the front surface electrode of the semiconductor element and the gold plating film or the silver plating film, is primarily used.

However after intensive research by the present inventors, it became clear that the following problems exist. In the case of bonding using an aluminum wire or solder where heat resistance is low, and in the case of bonding using conductive adhesive where a heat resistance of epoxy resin used as the binder is low, and a thermal conductivity that is also low, none can provide electronic components that can operate under a high temperature environment (e.g. continuous operation at 175° C.), which are currently in demand. Further, in the case of bonding using conductive adhesive, Ag is used as the conductive filler, but epoxy resin, which is used as the binder, is used for bonding. Therefore the adhesion mechanism is different from the bonding using a conductive composition containing Ag particles, and the characteristics demanded for the bonding target also differs considerably. In the case of using a bonding layer containing Ag particles, heat resistance under the high temperature environment can be implemented. However if the bonding layer containing Ag particles is used for bonding, the bonding strength with the plating metal on the outermost surface of the front surface electrode of the semiconductor element greatly depends on the type and the film thickness of the plating metal, which means that the bonding conditions to acquire high bonding strength must be considered.

SUMMARY OF THE INVENTION

To solve the problems of the prior art, it is an object of the present invention to provide an electronic component having high bonding strength, and a manufacturing method for an electronic component. It is another object of the present invention to provide an electronic component having high heat resistance, and a manufacturing method for an electronic component. It is still another object of the present invention to provide an electronic component having high heat radiation performance, and a manufacturing method for an electronic component.

To solve the above problems and achieve the objects of the present invention, an electronic component according to this invention has the following characteristics. A conductive portion is disposed on a surface of a semiconductor element. A first metal film formed of a material, of which major component is copper, is disposed on a surface of the conductive portion. A second metal film is disposed on a surface of the first metal film. The second metal film is formed of a metal having less ionization tendency than the first metal film. A bonding layer containing silver particles is disposed on a surface of the second metal film.

In the electronic component according to this invention, the semiconductor element is formed of silicon or silicon carbide, and the conductive portion is formed of a material of which major component is at least copper or aluminum.

In the electronic component according to this invention, the second metal film is formed of a material of which major component is silver.

In the electronic component according to this invention, the first metal film is a plating film or a deposition film.

In the electronic component according to this invention, the second metal film is a plating film or a deposition film.

In the electronic component according to this invention, the bonding layer is a sintered body formed by being heated at a temperature of 200° C. to 350° C. and pressurized at a pressure of 0.25 MPa to 30 MPa.

In the electronic component according to this invention, the second metal film does not contain nickel precipitates which decrease a bonding strength between the bonding layer and the second metal film.

To solve the above problems and achieve the objects of the present invention, a manufacturing method for an electronic component according to this invention has the following characteristics. First a first metal film formed of a material of which major component is copper is formed on the surface of a conductive portion disposed on a surface of a semiconductor wafer. Then a second metal film formed of a material of which major component is a metal having a less ionization tendency than the first metal film is formed on a surface of the first metal film. Then a conductive material containing silver particles is coated on a surface of the second metal film. And then the conductive material is sintered by heat treatment.

In the manufacturing method for an electronic component according to this invention, the conductive portion, formed of a material of which major component is at least copper or aluminum, is formed on the surface of the semiconductor wafer formed of silicon or silicon carbide.

In the manufacturing method for an electronic component according to this invention, the second metal film is formed of a material of which major component is silver.

In the manufacturing method for an electronic component according to this invention, the first metal film is formed by a plating method, a sputtering method or a deposition method.

In the manufacturing method for an electronic component according to this invention, the second metal film is formed by a plating method, a sputtering method or a deposition method.

In the manufacturing method for an electronic component according to this invention, the conductive material is sintered by being pressurized at a pressure of 0.25 MPa to 30 MPa while being heated at a temperature of 200° C. to 350° C. in the heat treatment.

In the manufacturing method for an electronic component according to this invention, nickel that decreases a bonding strength between the bonding layer, which is a sintered body of the conductive material, and the second metal film, does not particulate in the second metal film in the heat treatment.

According to this invention, the first metal film of which major component is copper (Cu) is formed on the surface of the conductive portion, whereby the second metal film, which has strong adhesion with the bonding layer containing silver particles (hereafter called "Ag bonding layer"), can be formed on the outermost surface of the conductive portion. Therefore the Ag boning layer can be used to bond the second metal film on the outermost surface of the conductive portion and the metal plate for electrically connecting the conducting portion with another material. As a result, bonding strength can be increased compared with a case of using a solder bonding layer to bond the second metal film and the metal plate. Moreover, heat resistance can be further improved than the case of bonding the conductive portion and the metal plate using solder.

According to this invention, the first metal film of which component is Cu is formed on the surface of the conductive portion, whereby Ni particles, which decrease the bonding strength with the Ag bonding layer, do not precipitate in the second metal film. Therefore a decrease in bonding strength between the conductive portion and the Ag bonding layer can be prevented, and the conductive portion and the metal plate can be firmly bonded via the Ag bonding layer.

According to this invention, the second metal film, of which major component is Ag, is formed on the outermost surface of the conductive portion, whereby the precipitation of Ni particles in the surface layer of the second metal film on the Ag bonding layer side can be suppressed, even if the first metal film contains Ni, for example. As a result, a decrease in the bonding strength between the conductive portion and the first Ag bonding layer can be prevented.

According to this invention, each member is bonded using the Ag bonding layer, whereby an electric component having the characteristics of the Ag bonding layer, that is, a high melting point (approximately 960° C.), thermal conductivity (100 W/m·K to 300 W/m·K), and electric resistance (1 μΩcm to 3 μΩcm can be fabricated (manufactured). Further, according to this invention, the first metal film is formed with a material of which major component is Cu having a thermal conductivity higher than Ni. And a higher heat radiation performance can be acquired than the case of forming the first metal film using a material of which major component is Ni.

According to the electric component and the manufacturing of the electric component, an electronic component having high bonding strength can be provided. Further, according to the electronic component and the manufacturing method of the electric component, an electronic component having high heat resistance can be provided. And furthermore, according to the electronic component and the manufacturing method of the electronic component, an electronic component having high heat radiation performance can be provided.

BRIEF DESCRIPTION OF THE DRAWINGS

FIG. 4 is a characteristic diagram depicting the bonding strength between the silver particle material and each single metal substance;

FIG. 5 is a characteristic diagram depicting the bonding strength of a main section of the electronic component according to the embodiment;

FIG. 6 is a table of the bonding strength of the main section of the electronic component corresponding to FIG. 5, which is converted into numeric values;

FIG. 8 is a table of the components of the metal film and the content percentage thereof corresponding to FIG. 7, which is converted into numerical values;

FIG. 10 is a table of the bonding strength of the electronic component corresponding to FIG. 9, which is converted into numerical values;

DETAILED DESCRIPTION

Preferred embodiments of the electronic component and a manufacturing method for the electronic component according to this invention will now be described with reference to the accompanying drawings. In the following description on the embodiments and the accompanying drawings, same composing elements are denoted with a same reference symbols, and redundant description is omitted.

Embodiments

Figure 1:
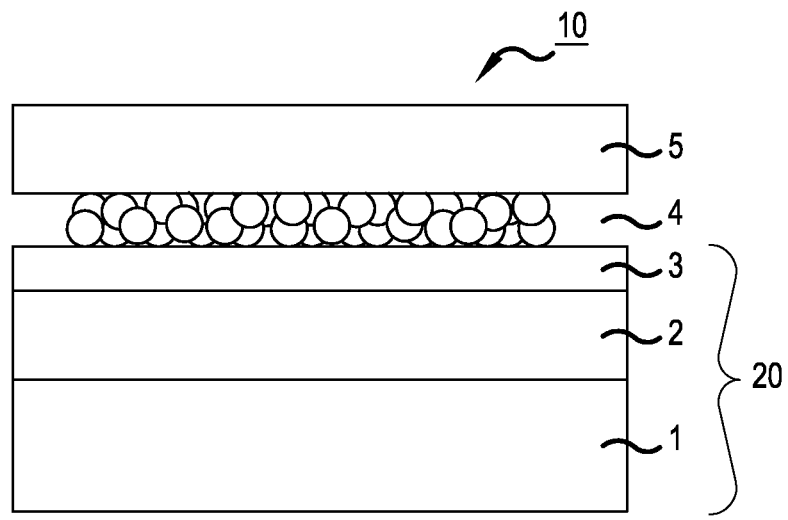
FIG. 1 is an enlarged cross-sectional view depicting a main section of an electronic component according to an embodiment.
Figure 2:
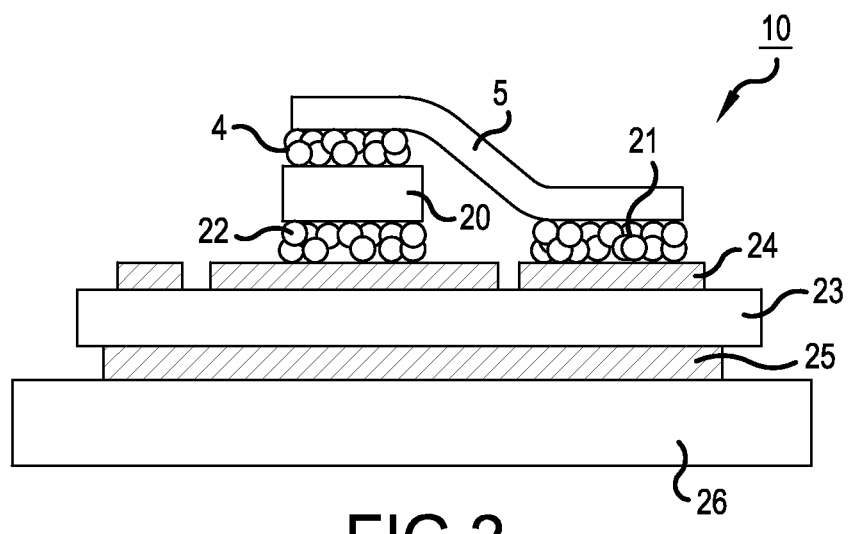
FIG. 2 is a cross-sectional view depicting the electronic component according to the embodiment.

A configuration of an electronic component according to an embodiment will be described. FIG. 1 is an enlarged cross-sectional view depicting a main section of the electronic component according to the embodiment. FIG. 2 is a cross-sectional view depicting the electronic component according to the embodiment. FIG. 1 shows an area near a bonding portion between a semiconductor chip 20 and a metal plate 5 in FIG. 2. The electronic component 10 according to the embodiment shown in FIG. 1 and FIG. 2 is a semiconductor device having a package structure where the semiconductor chip 20 is mounted. The semiconductor chip 20 is formed of silicon (Si) or silicon carbide (SiC), for example. In FIG. 1, a semiconductor silicon portion of the semiconductor chip 20 is omitted.

The semiconductor chip 20 constitutes a semiconductor element, and a conductive portion 1 constituting a front surface electrode or the like of the semiconductor element is disposed on the front surface of the semiconductor chip 20. The conductive portion 1 is formed of copper (Cu), aluminum (Al) or an alloy thereof, for example. In concrete terms, the conductive portion 1 is formed of an aluminum-silicon (Al—Si) alloy or an aluminum-silicon-copper (Al—Si—Cu) alloy. Having Si in the conductive portion 1 suppresses aluminum spiking, and having Cu in the conductive portion 1 suppresses electro-migration.

On a surface of the conductive portion 1, a first metal film 2 and a second metal film 3 are deposited (formed) in this sequence. The first metal film 2 and the second metal film 3 will be described later. On a surface of the second metal film 3, one end of the metal plate 5 is bonded via a bonding layer 4 containing first silver (Ag) particles (hereafter called "first Ag bonding layer"). The other end of the metal plate 5 is bonded with a circuit pattern 24 on a front surface of an insulated substrate 23 via a bonding layer 21 containing second Ag particles (hereafter called "second Ag bonding layer"). On an outermost surface of the metal plate 5, a gold (Au) or silver (Ag) film, for example, is formed in order to improve bonding strength with the first and second Ag bonding layers 4 and 21.

On a rear surface of the semiconductor chip 20, a rear surface electrode (not illustrated) is disposed. On the outermost surface of the rear surface electrode, a gold film or a silver film is formed by, for example, a sputtering treatment. The rear surface electrode of the semiconductor chip 20 is bonded with the circuit pattern 24 on the front surface of the insulated substrate 23 via a bonding layer 22 containing third Ag particles (hereafter called "third Ag bonding layer"). On the outermost surface of the circuit pattern 24, an Au film or an Ag film, for example, is formed in order to improve bonding strength with the second and third Ag bonding layers 21 and 22.

The first to third Ag bonding layers 4, 21 and 22 are sintered bodies of a conductive composition (conductive material) containing Ag particles. If each member is bonded by the first to third Ag bonding layers 4, 21 and 22, heat resistance can be improved compared with a case of bonding each member by solder. In concrete terms, an electronic component 10 that can operate under a high temperature environment (e.g. continuous operation at 175° C.) by bonding each member by the first to third Ag bonding layer 4, 21 and 22.

The insulated substrate 23 may be a DCB substrate, where copper is directly bonded with the front and rear surfaces of the ceramic material, for example. The rear surface of the insulated substrate 23 is bonded with a front surface of a metal plate (Cu plate) 25 formed of copper, for example. A rear surface of the Cu plate 25 is bonded with a front surface of a base member 26. The base member 26 is formed of a material having a high thermal conductivity. The Cu plate 25 and the base member 26 may be bonded by a solder bonding layer, or by a bonding layer containing Ag particles (Ag bonding layer).

To bond the Cu plate 25 and the base member 26 via the Ag bonding layer, an Au film or an Ag film, in order to improve the bonding strength with the Ag bonding layer, for example, is formed on the outermost surface of the Cu plate 25. The front surface of the insulated substrate 23 (surface on the side of the semiconductor chip 20) is covered by a resin case (not illustrated) bonded with the periphery of the insulated substrate 23. The front surface electrode and the rear surface electrode of the semiconductor chip 20 are lead out of the resin case by terminals for an external electrode (not illustrated). The resin case is filled with sealing material (not illustrated), such as resin or gel.

The first metal film 2 and the second metal film 3 will be described next in detail. The first metal film 2 is formed on the surface of the conductive portion 1 before forming the second metal film 3, in order to form the second metal film 3 on the outermost surface of the conductive portion 1. The first metal film 2 has a high bonding strength with the conductive portion 1, and is formed of a material with which the second metal film 3 can be easily formed on the surface of the first metal film 2. In concrete terms, the first metal film 2 is formed of a material of which major component is copper (Cu). This is because the bonding strength with the second metal film 3 and the metal plate 5, which are bonded via the first Ag bonding layer 4, can be increased.

It is preferable that the first metal film 2 is formed of a material that does not contain nickel (Ni). The reason is as follows. To bond each member by the first to third Ag bonding layers 4, 21 and 22, a high temperature heat treatment must be performed at around 250° C. If nickel is contained in the first metal film 2, nickel particles precipitate in the front surface layer on the first Ag bonding layer 4 side inside the second metal film 3 by this heat treatment. This is because the bonding strength between the second metal film 3 and the metal plate 5 decreases due to the precipitation of nickel. The first metal film 2 is formed by an electro-plating method, an electroless plating method, a sputtering method (physical deposition method) or a chemical deposition method, for example.

The second metal film 3 is formed on the outermost surface of the semiconductor chip 20 in order to improve the bonding strength with the first Ag bonding layer 4. The second metal film 3 is formed of a material of which adhesion with the first Ag bonding layer 4 is high, and the ionization tendency is lower than the first metal film 2. In concrete terms, the second metal film 3 is formed of a material of which major component is silver or gold, for example. It is preferable that the second metal film 3 is formed of a material of which major component is silver. This is because the precipitation of nickel in the second metal film 3 can be suppressed more than the case of gold being the major component of the second metal film 3. The second metal film 3 is formed by an electro-plating method, an electroless plating method, a sputtering method (physical deposition method) or a chemical deposition method, for example.

Figure 3:
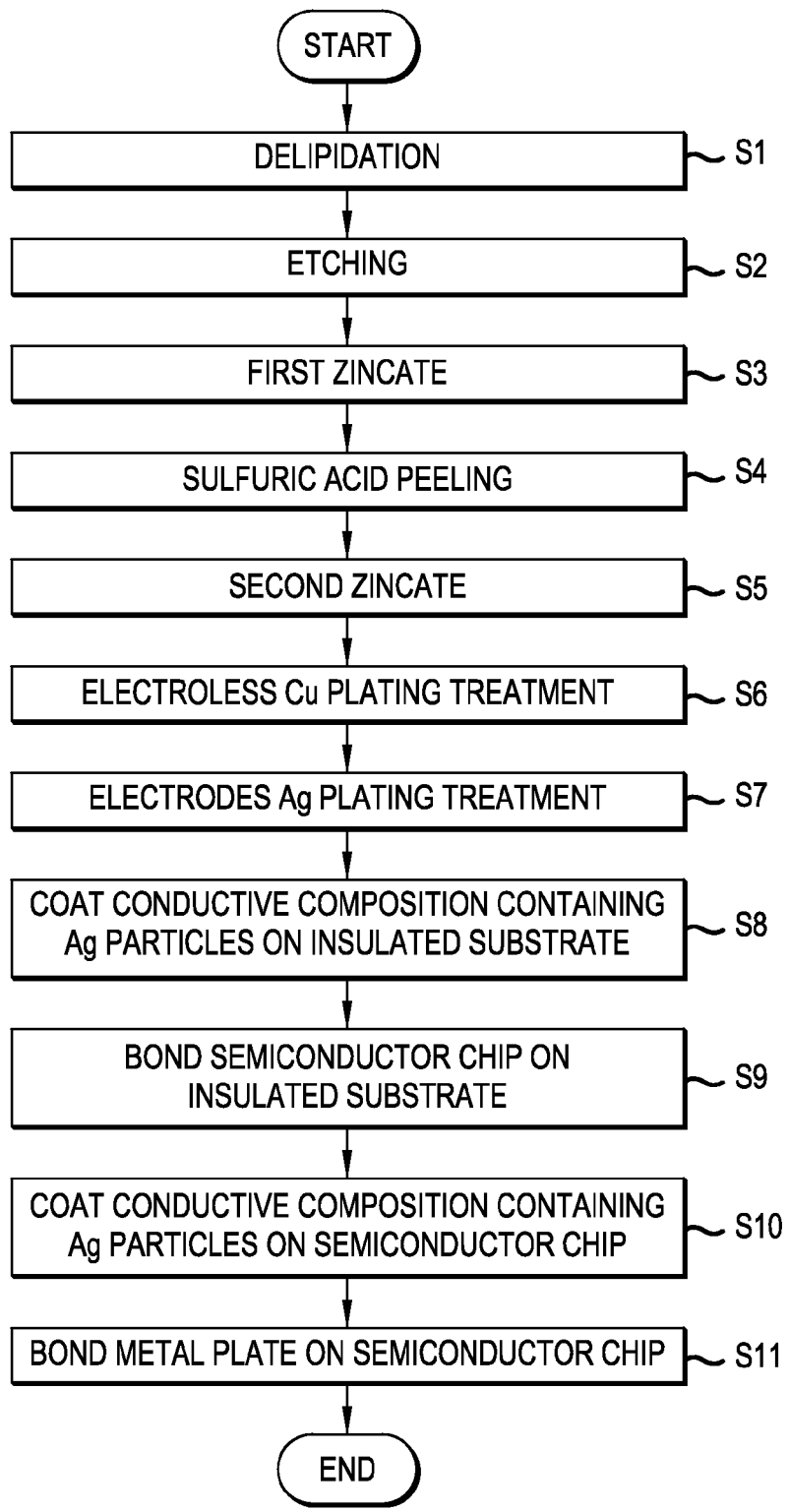
FIG. 3 is a flow chart depicting a manufacturing method for the electronic component according to the embodiment.

Now a manufacturing method for the electronic component 10 illustrated in FIG. 2 will be described. FIG. 3 is a flow chart depicting a manufacturing method for the electronic component according to the embodiment. A case of forming the first metal film 2 and the second metal film 3 by an electroless plating treatment will be described as an example. First an aluminum-silicon electrode is formed as the conductive portion 1 on the front surface of the semiconductor wafer by a sputtering method, for example. Then the semiconductor wafer is cut into desired chip sizes, and the semiconductor chip 20 is fabricated. Before performing plating treatment to form the first and second metal films 2 and 3 (steps S6 and S7), a plating pre-treatment (steps S1 to S5) is performed on a semiconductor chip 20.

In concrete terms, for the plating pre-treatment, delipidation treatment is performed on the semiconductor chip 20 (step S1) first. Then particles, organic substances and oxide films that adhere to the surface of the semiconductor chip 20 are removed by etching (step S2). Acid cleaning using nitric acid, for example, may be performed on the semiconductor chip 20 after the treatment in step S2, so that insoluble etching residue generated on the surface of the semiconductor chip 20 by the treatment in step S2 is removed. Then zincate (a zinc substitute) treatment (first zincate treatment) is performed so as to improve adhesion of the front surface of the semiconductor chip 20 with the first metal film 2, which is formed in a later step (step S3).

Then acid cleaning using nitric acid, for example, is performed on the semiconductor chip 20, and a substitute zinc layer formed on the surface of the semiconductor chip 20 in step 3 is removed (nitric acid peeling, step S4). Then the zincate treatment is performed again (second zincate treatment) so as to improve adhesion of the front surface of the semiconductor chip 20 with the first metal film 2, and the plating pre-treatment ends (step S5). Between each treatment in step S1 to S5, a treatment to wash the surface of the conductive portion 1 with water is performed respectively.

Then a plating treatment for forming the first metal film 2 and the second metal film 3 is performed (steps S6, S7). In concrete terms, an electroless Cu plating treatment, for example, is performed, whereby the first metal film 2 is formed on the surface of the conductive portion 1 (step S6). After washing the semiconductor chip 20 with water, an electroless Ag plating treatment, for example, is performed, whereby the second metal film 3 is formed on the surface of the first metal film 2 (step S7).

Then the semiconductor chip 20 is mounted on the insulated substrate 23. In concrete terms, a paste type conductive composition containing Ag particles, which becomes the third Ag bonding layer 22, is coated on the surface of the circuit pattern 24 of the insulated substrate 23 at a desired pattern (step S8). After the semiconductor chip 20 is placed on the surface of the paste type conductive composition containing Ag particles such that the rear surface of the semiconductor chip 20 faces downward (insulated substrate 23 side), the conductive composition containing Ag particles is sintered under pressure while being heated. Thereby the semiconductor chip 20 is bonded with the surface of the circuit pattern 24 on the insulated substrate 23 via the third Ag bonding layer 22 (step S9).

Then a paste type conductive composition containing Ag particles, which becomes the first Ag bonding layer 4, is coated on the surface of the second metal film 3, which is the outermost surface of the semiconductor chip 20, at a desired pattern (step S10). At this time, the paste type conductive composition containing the AG particles, which becomes the second Ag bonding layer 21, is also coated on the front surface of the circuit pattern 24 of the insulated substrate 23 at a desired pattern. After placing the metal plate 5 on the surface of the paste type conductive composition containing Ag particles, the conductive composition containing Ag particles is sintered under pressure while being heated. Thereby one end of the metal plate 5 is bonded with the surface of the second metal film 3, which is the outermost surface of the semiconductor chip 20, via the first Ag bonding layer 4 (step S11). The other end of the metal plate 5 is bonded with the surface of the circuit pattern 24 of the insulated substrate 23 via the second Ag bonding layer 21. By the above steps, the electronic component 10 is completed.

For the heat treatment for sintering the conductive composition containing Ag particles, it is preferable that the conductive composition is pressurized at a pressure of 0.25 MPa to 30 MPa while being heated at a temperature of 200° C. to 350° C., for example. Thereby the paste type conductive composition containing Ag particles is sintered, and the first Ag bonding layer 4 having high bonding strength and excellent heat resistance and heat radiation performance can be formed.

As described above, according to the embodiment, the first metal film of which major component is Cu is formed on the surface of the conductive portion (the front surface electrode of the semiconductor element), whereby the second metal film having high adhesion with the first Ag bonding layer can be formed on the outermost surface of the conductive portion. Therefore the first Ag bonding layer can be used to bond the second metal film on the outermost surface of the conductive portion and the metal plate for electrically connecting the conductive portion to another member. As a result, the bonding strength can be increased compared with a case of using a solder bonding layer to bond the second metal film and the metal plate. Further, heat resistance can be improved to be high enough to operate in a high temperature environment (e.g. continuous operation at 175° C.) compared with the case of bonding the conductive portion and the metal plate by solder.

According to the embodiment, the first metal film of which major component is Cu is formed on the surface of the conductive portion, whereby the Ni particles which decrease the bonding strength with the first Ag bonding layer do not precipitate in the second metal film. Therefore a decrease in the bonding strength between the conductive portion and the first Ag bonding layer can be prevented. This means that the conductive portion and the metal plate can be strongly bonded via the first Ag bonding layer. As a consequence, reliability, which is evaluated by a P/C (Power/Cycle) test, for example, improves. In concrete terms, in the case of an electronic component where the bonding is performed by the first Ag bonding layer, the first Ag bonding layer cracks during the P/C test, for example, and pealing occurs in the cracked portion, which ends up with breakdown of the electronic component. If the bonding strength between the conductive portion and the first Ag bonding layer is increased, cracking rarely occurs in the first Ag bonding layer, hence the life of the electronic component improves.

According to the embodiment, the second metal film of which major component is Ag is formed on the outermost surface of the conductive portion, whereby precipitation of the Ni particles in the surface layer of the second metal film on the first Ag bonding layer side can be suppressed, even if the first metal film or the second metal film contains Ni. As a result, a decrease in the bonding strength between the conductive portion and the first Ag bonding layer can be prevented.

According to this embodiment, each member is bonded using the first to third Ag bonding layers, whereby an electronic component having the characteristics of the first to third Ag bonding layers, that is a high melting point (approximately 960° C.), thermal conductivity (100 W/m·K to 300 W/m·K), and electric resistance (1 μΩcm to 3 μΩcm), can be fabricated (manufactured). As a result, an electronic component having high heat resistance and high heat radiation performance can be fabricated. Further, according to this embodiment, the first metal film is formed of a material of which major component is Cu, which has a higher thermal conductivity than Ni, hence a higher heat radiation performance than the case of forming the first metal film using a material of which major component is Ni can be implemented.

Example 1

The bonding strength of the bonding layer (Ag bonding layer) containing Ag particles was verified. FIG. 4 is a characteristic diagram depicting the bonding strength between the silver particle material and each single metal substance. First a metal layer was formed on a surface of a silicon wafer, which was cut into 10 mm×10 mm sized semiconductor chips. Then a paste type conductive composition (Ag particle material) containing Ag particles was coated on the metal layer of the semiconductor chip. Then the conductive composition was sintered under pressure while being heated at a temperature of 250° C. for five minutes, so as to form an Ag bonding layer on the metal layer. A plurality of samples were fabricated in this way, with varying the pressurizing amount when the conductive composition is heated, and a shear strength test was conducted on each sample, so as to evaluate the bonding strength between the metal layer and the Ag bonding layer of each sample based on the shear force.

The strength test was conducted on each sample, where the metal layer on the surface of the silicon wafer is formed of a single substance of Ag, Au, Cu and Ni respectively. FIG. 4 shows the measurement result of the shear strength test that tests the bonding strength between each metal layer and the Ag bonding layer. As the result in FIG. 4 shows, it was confirmed that in each metal, the bonding strength with the Ag bonding layer increases as the pressurizing amount becomes higher. It was also confirmed that the bonding strength with the Ag bonding layer is different depending on the type of the metal. In concrete terms, the bonding strength with the Ag bonding layer is highest when using Ag, and diminishes in the sequence of Au, Cu and Ni. By this result, it was confirmed that the bonding strength with the Ag bonding layer is higher when Cu is used than Ni.

Example 2

Then the bonding strength between the conductive portion 1 on the surface of the semiconductor chip 20 and the metal plate 5 was verified. FIG. 5 is a characteristic diagram depicting the bonding strength of the main section of the electronic component according to the embodiment. FIG. 6 is a table of the bonding strength of the main section of the electronic component corresponding to FIG. 5, which is converted into numeric values. First a semiconductor chip 20 was fabricated according to the embodiment by forming a Cu plating film to have a 5 μm thickness as the first metal film 2, then forming an Ag plating film to have a 0.1 μm thickness as the second metal film 3, and then bonding a metal plate 5 via the first Ag bonding layer 4 (hereafter called "Example 2").

To be specific, Example 2 was fabricated as follows. First as the semiconductor chip 20, an aluminum silicon (AlSi) electrode, to be the conductive portion 1, was formed on one principal surface of a six inch silicon wafer by a sputtering method so as to have a 5 μm thickness, which was cut into 10 mm×10 mm sized chips. After performing the plating pretreatment, the Cu plating film, which becomes the first metal film 2, was formed to have a 5 μm thickness on the conductive portion 1 by the electroless Cu plating treatment. Then the Ag plating film, which becomes the second metal film 3, was formed to have a 0.1 μm thickness on the first metal film 2 by the electroless Ag plating treatment.

Then a paste type conductive composition (Ag particle material) containing Ag particles was coated on the second metal film 3. At this time, using a 100 μm thick metal mask having an opening of which size is 8 mm×8 mm, the conductive composition was coated on an area, which has the same area size as the opening of the metal mask, on the surface of the second metal film 3. Then the Ag plated metal plate 5 was placed on an Ag particle material, and the conductive composition was sintered under pressure while being heated at a temperature of 250° C. for five minutes, so as to form a first Ag bonding layer 4 on the second metal film 3. Thereby Example 2 (first metal film 2/second metal film 3=Cu/Ag) where the conductive portion 1 and the metal plate 5 are bonded via the first Ag bonding layer 4 is completed.

For comparison, Comparative Examples 1 and 2, of which configurations of the first and second metal films 2 and 3 are different from Example 2, were fabricated. For Comparative Example 1, an Ni plating film was formed to have a 5 μm thickness as the first metal film, and an Au plating film was formed to have a 0.05 μm thickness as the second metal film (first metal film/second metal film=Ni/Au). For Comparative Example 2, an Ni plating film is formed to have a 5 μm thickness as the first metal film, and an Ag plating film was formed to have a 0.1 μm thickness as the second metal film (first metal film/second metal film=Ni/Ag). The configurations of Comparative Examples 1 and 2, other than the first and second metal films, are the same as Example 2. The manufacturing methods for Comparative Examples 1 and 2 are the same as the manufacturing method for Example 2, except for the material and the thickness of the plating film which is formed by the plating treatment.

FIG. 5 and FIG. 6 show the results when a plurality of samples were fabricated with varying the pressurizing amount when the conductive composition is heated, and the shear strength test was conducted on Example 2, Comparative Example 1 and Comparative Example 2. The shear strength test is a strength test that evaluates the bonding strength between the conductive portion 1 and the metal plate 5 based on the shear force.

As the results in FIG. 5 and FIG. 6 show, the bonding strength of Example 2 and Comparative Example 2 is higher than Comparative Example 1. In concrete terms, if the first Ag bonding layer 4 is sintered under a pressurizing amount of 10 MPa, for example, the bonding strength between the conductive portion 1 and the metal plate 5 is 60.1 MPa and 58.8 MPa respectively in Example 2 and Comparative Example 2, but is 42.5 MPa in Comparative Example 1. In other words, the bonding strength between the conductive portion 1 and the metal plate 5 is approximately the same in Example 2 and Comparative Example 2, where the second metal film is the Ag plating film, and these values are higher than Comparative Example 1, where the second metal film is the Au plating film.

Therefore it was confirmed that the metal constituting the second metal film 3 on the outermost surface of the front surface electrode (conductive portion 1) of the semiconductor element greatly influences the bonding strength between the conductive portion 1 and the metal plate 5. It was also confirmed that the bonding strength between the conductive portion 1 and the metal plate 5 can be improved by forming the second metal film 3 of which major component is Ag. And it was also confirmed that the bonding strength between the conductive portion 1 and the metal plate 5 can be improved as the pressurizing amount, when the first Ag bonding layer 4 is sintered, is increased. A pressurizing amount of 0 MPa is the case when the first Ag bonding layer 4 is not pressurized.

Example 3

Then the bonding strength of the electronic component 10 was verified. To fabricate the electronic component 10 as a product, the semiconductor chip 20 is bonded with the circuit pattern 24 on the insulated substrate 23 before bonding the metal plate 5 with the conductive portion 1 on the surface of the semiconductor chip 20 as described in the embodiment. Therefore the influence of the step of bonding the semiconductor chip 20 with the circuit pattern 24 of the insulated substrate 23 on the bonding strength between the conductive portion 1 on the surface of the semiconductor chip 20 and the metal plate 5 was verified. First the Ni precipitation amount in the second metal film 3 was measured.

Figure 7:
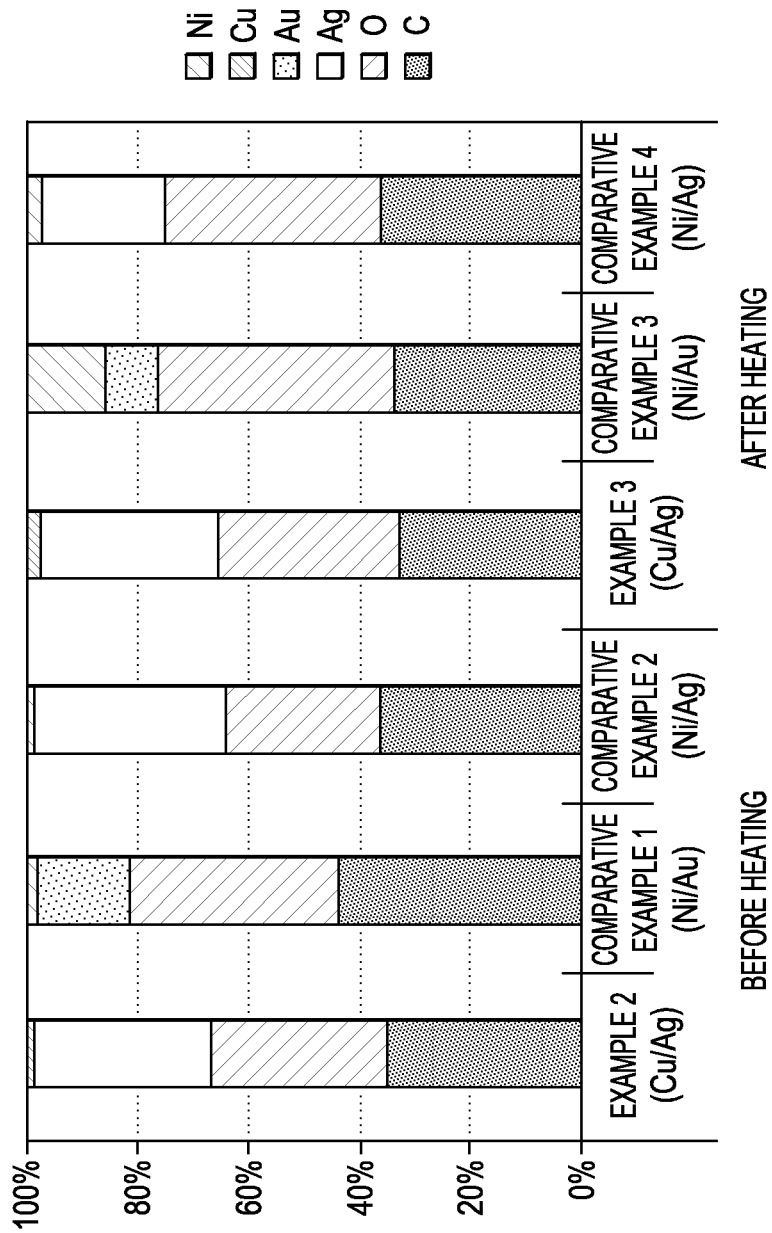
FIG. 7 is a characteristic diagram depicting components of the metal film constituting the electronic component of the embodiment, and the content percentage thereof.

FIG. 7 is a characteristic diagram depicting components of the metal film constituting the electronic component of the embodiment, and the content percentage thereof. FIG. 8 is a table of the components of the metal film and the component percentage thereof corresponding to FIG. 7, which is converted into numerical values. In FIG. 7 and FIG. 8, the phrase "before heating" refers to the case when the step of bonding the semiconductor chip 20 with the circuit pattern 24 on the insulated substrate 23 is not performed. In other words, "before heating" applies to the case of Example 2 and Comparative Examples 1 and 2. The phrase "after heating" refers to the case when the step of bonding the semiconductor chip 20 with the circuit pattern 24 on the insulated substrate 23 is performed, whereby the electronic component 10 according to the embodiment (hereafter called "Example 3") is fabricated (the same for FIG. 9 and FIG. 10). The configuration of Example 3, other than the insulated substrate 23 and the third Ag bonding layer 22, is the same as Example 2.

To be specific, Example 3 was fabricated as follows. First just like Example 2, the semiconductor chip 20, on which an AlSi electrode to be the conductive portion 1 is formed, was prepared, and a Cu plating film which becomes the first metal film 2 and an Ag plating film which becomes the second metal film 3 were sequentially formed on the conductive portion 1. Then a paste type conductive composition (Ag particle material) containing Ag particles was coated on the circuit pattern 24 of the insulated substrate 23. At this time, using a metal mask having an opening of which size is larger than the chip size, the conductive composition was coated on an area, which has the same area size as the opening of the metal mask, on the surface of the circuit pattern 24 of the insulated substrate 23.

Then the semiconductor chip 20 was placed on the Ag particle material such that the rear surface of the semiconductor chip 20 faces the insulated substrate 23, and the conductive composition was sintered by being pressurized at a pressure of 10 MPa while heating at a temperature of 250° C. for five minutes, so as to form a third Ag bonding layer 22 on the circuit pattern 24 of the insulated substrate 23. Thereby the semiconductor chip 20 is bonded with the circuit pattern 24 on the insulated substrate 23 via the third Ag bonding layer 22. Then just like Example 2, a first Ag bonding layer 4 was formed on the second metal film 3 of the semiconductor chip 20, and the conductive portion 1 and the metal plate 5 were bonded via the first Ag bonding layer 4, whereby Example 3 was completed. In Example 3, the pressurizing amount under high temperature heat treatment to sinter the first Ag bonding layer 4 is 10 MPa.

For comparison after heating, Comparative Examples 3 and 4, of which configurations of the first and second metal films 2 and 3 are different from Example 3, were fabricated. The configuration of Comparative Example 3, other than the insulated substrate and the third Ag bonding layer, is the same as Comparative Example 1. The configuration of Comparative Example 4, other than the insulated substrate and the third Ag bonding layer, is the same as Comparative Example 2. FIG. 7 and FIG. 8 show the result when the precipitation amount of Ni in the second metal film was measured in Example 3 and Comparative Examples 3 and 4 respectively. FIG. 7 and FIG. 8 show the average content percentage (%) of each component measured at a several arbitrary locations on the surface layer of the second metal film on the first Ag bonding layer side.

As FIG. 7 and FIG. 8 show, in the examples where the Cu plating film is formed as the first metal film 2, precipitation of Ni in the second metal film 3 was not observed both before heating (Example 2) and after heating (Example 3). In the case of the comparative examples where the Ni plating film is formed as the first metal film, on the other hand, the precipitation of Ni in the second metal film 3 was observed both before heating (Comparative Examples 1 and 2) and after heating (Comparative Examples 3 and 4). In the case of the comparative examples where the Ni plating film is formed as the first metal film, it was confirmed that the Ni content percentage increases after heating (Comparative Examples 3 and 4) compared with before heating (Comparative Examples 1 and 2).

In concrete terms, in the case of forming the Au plating film as the second metal film, it was confirmed that the Ni content percentage of the second metal film is 1.8% before heating (Comparative Example 1), but becomes 13.8% after heating (Comparative Example 3). In the case of forming the Ag plating film as the second metal film, it was confirmed that the Ni content percentage of the second metal film is 0.9% before heating (Comparative Example 2), but becomes 2.8% after heating (Comparative Example 4). As a consequence, it was confirmed that more Ni precipitates when the Au plating film is formed as the second metal film, compared with the case of forming the Ag plating film as the second metal film.

Figure 9:
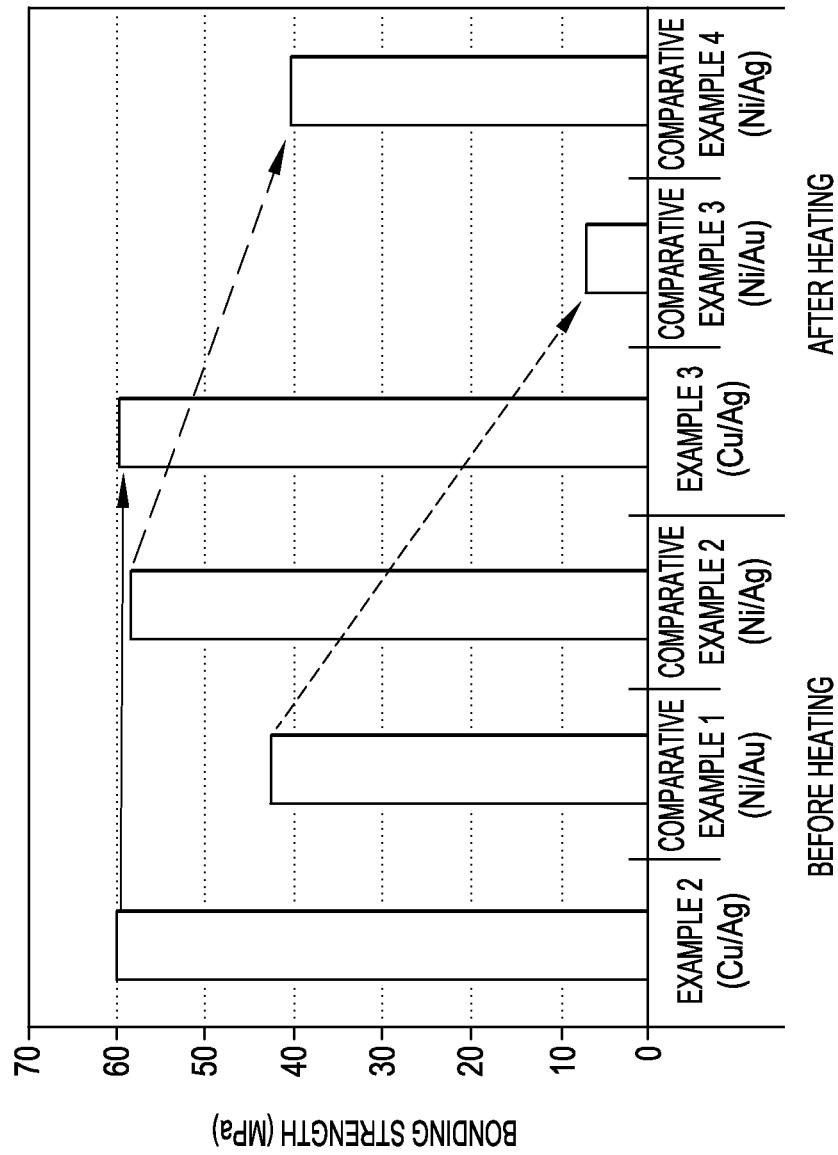
FIG. 9 is a characteristic diagram depicting the bonding strength of the electronic component according to the embodiment.
Figure 11:
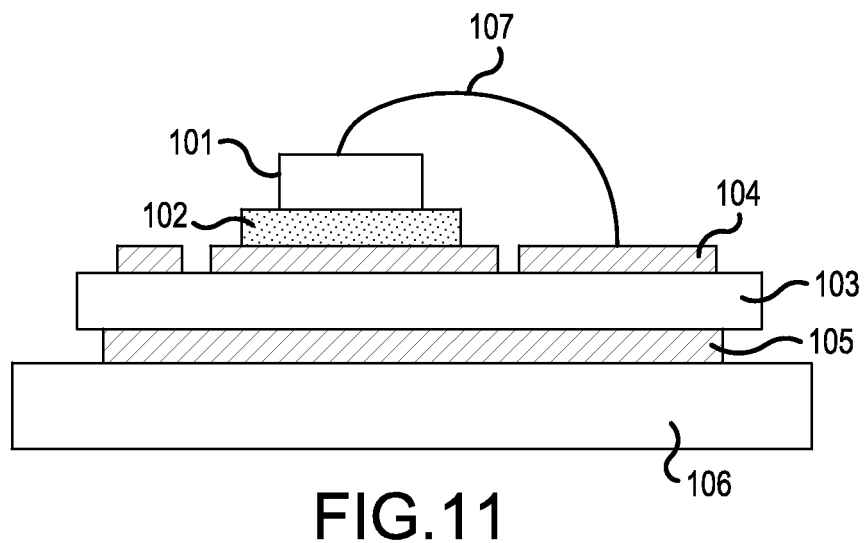
FIG. 11 is a cross-sectional view depicting a main section of a semiconductor device having a conventional package structure.
Figure 12:
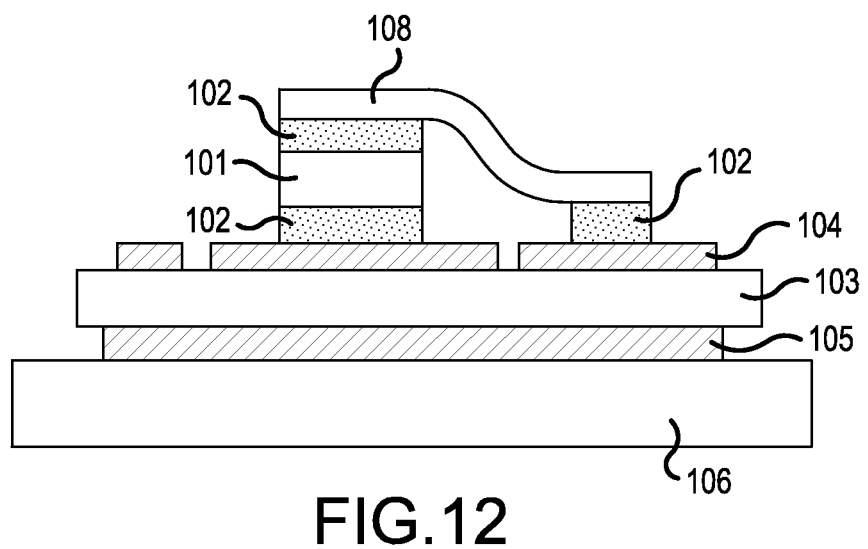
FIG. 12 is a cross-sectional view depicting a main section of another semiconductor device having a conventional package structure.

Then the relationship between the Ni content percentage of the second metal film 3 and the bonding strength of the electronic component 10 was verified. FIG. 9 is a characteristic diagram depicting the bonding strength of the electronic component according to the embodiment. FIG. 10 is a table of the bonding strength of the electronic components corresponding to FIG. 9, which is converted into numerical values. FIG. 9 and FIG. 10 show the results of when the bonding strength was measured for Example 3 and Comparative Examples 3 and 4. In FIG. 9 and FIG. 10, the bonding strength of Example 2 and Comparative Examples 1 and 2 is the bonding strength when the pressurizing amount is 10 MPa, as shown in FIG. 5 and FIG. 6.

As the results in FIG. 9 and FIG. 10 show, it was confirmed that in the case of Comparative Examples 1 and 3 of which the Ni content percentage is the highest (first metal film/second metal film=Ni/Au), the bonding strength decreases considerably, from 42.5 MPa to 6.6 MPa (indicated by the fine broken arrow line in FIG. 9). Even in the case of Comparative Examples 2 and 4 of which the Ni content percentage is lower than Comparative Examples 1 and 3 (first metal film/second metal film=Ni/Ag), it was confirmed that the bonding strength decreases from 58.8 MPa to 39.8 MPa (indicated by the rough broken arrow line in FIG. 9). In the case of the Examples 2 and 3, where Ni does not precipitate (first metal film 2/second metal film 3=Cu/Ag) however, the bonding strength before heating is 60.1 MPa and after heating is 59.5 MPa, that is, the bonding strength hardly decreases (indicated by the solid arrow line in FIG. 9).

Therefore as the results in FIG. 7 to FIG. 10 show, it was confirmed that the decrease in bonding strength of the electronic component 10 can be suppressed both before heating and after heating if the first metal film 2, of which major component is Cu, is formed. It was also confirmed that the adhesion of the second metal film 3 and the first Ag bonding layer 4 can be improved compared with the case of forming the first metal film 2 of which major component is Ni, if the first metal film 2 of which the major component is Cu, is formed. It was also confirmed that if the second metal film 3, of which major component is Ag, is formed, the precipitation of Ni after heating can be suppressed even though Ni precipitates in the second metal film 3.

In the above description of this invention, the front surface electrode of the semiconductor element and the metal plate are bonded, but the present invention is not limited to this, but can also be applied to the case of bonding another conductive portion with a metal plate that electrically connects this conductive portion with another member.

As described above, the electronic component and the manufacturing method for the electronic component according to this invention are useful for a semiconductor device having a package structure, such as an electronic component having a structure of bonding each member for electrical connection.

What is claimed is:

1. An electronic component, comprising:
    a conductive portion which is disposed on a surface of a semiconductor element;
    a first metal film, which is disposed on a surface of the conductive portion, and is formed of a material of which major component is copper;
    a second metal film, which is disposed on a surface of the first metal film, and is formed of a material of which major component is a metal having a less ionization tendency than the first metal film;
    a bonding layer, which is disposed on a surface of the second metal film, and contains silver particles; and
    a metal plate of which one end is bonded with the bonding layer and an other end is bonded with a circuit pattern provided on a surface of an insulating substrate on which the semiconductor element is mounted.

2. The electronic component according to claim 1, wherein the semiconductor element is formed of silicon or silicon carbide, and
    the conductive portion is formed of a material of which major component is at least copper or aluminum.

3. The electronic component according to claim 1, wherein the second metal film is formed of a material of which major component is silver.

4. The electronic component according to claim 1, wherein the first metal film is a plating film or a deposition film.

5. The electronic component according to claim 1, wherein the second metal film is a plating film or a deposition film.

6. The electronic component according to claim 1, wherein the bonding layer is a sintered body formed by being heated at a temperature in the range of 200° C. to 350° C. and pressurized at a pressure in the range of 0.25 MPa to 30 MPa.

7. The electronic component according to claim 1, wherein the second metal film does not contain nickel precipitates which decrease a bonding strength between the bonding layer and the second metal film.

8. A manufacturing method for an electronic component, comprising the steps of:
    forming a first metal film formed of a material of which major component is copper, on a surface of a conductive portion disposed on a surface of a semiconductor wafer;
    forming a second metal film formed of a material of which major component is a metal having a less ionization tendency than the first metal film, on a surface of the first metal film;
    coating a conductive material containing silver particles on a surface of the second metal film;
    placing, on the conductive material, one end of a metal plate of which an other end is bonded with a circuit pattern provided on a surface of a insulating substrate on which the semiconductor element is mounted; and
    sintering the conductive material by heat treatment.

9. The manufacturing method for an electronic component according to claim 8, wherein
    the conductive portion, formed of a material of which major component is at least copper or aluminum, is formed on the surface of the semiconductor wafer formed of silicon or silicon carbide.

10. The manufacturing method for an electronic component according to claim 8, wherein
    the second metal film is formed of a material of which major component is silver.

11. The manufacturing method for an electronic component according to claim 8, wherein
    the first metal film is formed by a plating method, a sputtering method or a deposition method.

12. The manufacturing method for an electronic component according to claim 8, wherein
    the second metal film is formed by a plating method, a sputtering method or a deposition method.

13. The manufacturing method for an electronic component according to claim 8, wherein
    the conductive material is sintered by being pressurized at a pressure in the ranges of 0.25 MPa to 30 MPa while being heated at a temperature in the range of 200° C. to 350° C. in the heat treatment.

14. The manufacturing method for an electronic component according to claim 8, wherein
    nickel that decreases a bonding strength between a bonding layer, which is a sintered body of the conductive material, and the second metal film, does not particulate in the second metal film in the heat treatment.

* * * * *